US010204915B1

(12) United States Patent
Su et al.

(10) Patent No.: US 10,204,915 B1
(45) Date of Patent: Feb. 12, 2019

(54) METHOD OF FORMING DYNAMIC RANDOM ACCESS MEMORY (DRAM)

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yu-Shan Su, Taipei (TW); Chia-Wei Wu, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/894,840

(22) Filed: Feb. 12, 2018

(30) Foreign Application Priority Data

Feb. 5, 2018 (CN) .......................... 2018 1 0110089

(51) Int. Cl.
| H01L 27/108 | (2006.01) |
| H01L 21/28 | (2006.01) |
| H01L 21/02 | (2006.01) |
| H01L 29/51 | (2006.01) |
| H01L 21/311 | (2006.01) |
| H01L 29/66 | (2006.01) |
| H01L 29/49 | (2006.01) |
| H01L 21/3105 | (2006.01) |

(52) U.S. Cl.
CPC .... *H01L 27/10894* (2013.01); *H01L 21/0217* (2013.01); *H01L 21/0228* (2013.01); *H01L 21/28123* (2013.01); *H01L 21/31051* (2013.01); *H01L 21/31111* (2013.01); *H01L 29/4983* (2013.01); *H01L 29/518* (2013.01); *H01L 29/6653* (2013.01); *H01L 29/6656* (2013.01)

(58) Field of Classification Search
CPC ......... H01L 27/10894; H01L 21/31051; H01L 29/4983; H01L 29/6653; H01L 29/6656; H01L 29/518; H01L 21/0228; H01L 21/0217; H01L 21/28123; H01L 21/31111; H01L 27/10847; H01L 27/10897; H01L 27/10823; H01L 21/31144; H01L 27/10885; H01L 21/31116; H01L 29/665
See application file for complete search history.

(56) References Cited

U.S. PATENT DOCUMENTS

| 8,309,449 | B2 | 11/2012 | Jeong | |
| 9,373,625 | B2 | 6/2016 | Kim | |
| 2003/0003661 | A1* | 1/2003 | Lee | H01L 27/105 |
| | | | | 438/258 |
| 2004/0075129 | A1* | 4/2004 | Tu | H01L 28/57 |
| | | | | 257/303 |
| 2008/0157179 | A1* | 7/2008 | Kim | H01L 21/2652 |
| | | | | 257/321 |
| 2017/0170074 | A1* | 6/2017 | Liu | H01L 21/823814 |

* cited by examiner

*Primary Examiner* — Thanh T Nguyen
(74) *Attorney, Agent, or Firm* — Winston Hsu

(57) ABSTRACT

A method of forming a dynamic random access memory (DRAM) includes the following steps. A substrate includes a memory area and a logic area. A stacked structure is formed on the substrate of the memory area and a gate structure is formed on the substrate of the logic area. A first mask layer is formed on the stacked structure and the gate structure. A densification process is performed to densify the first mask layer. A second mask layer is formed on the first mask layer. A part of the second mask layer and a part of the first mask layer are removed to form a first spacer on sidewalls of the gate structure.

14 Claims, 7 Drawing Sheets

METHOD OF FORMING DYNAMIC RANDOM ACCESS MEMORY (DRAM)

BACKGROUND OF THE INVENTION

1. Field of the Invention

The present invention relates generally to a method of forming a dynamic random access memory (DRAM), and more specifically to a method of forming spacers of a dynamic random access memory (DRAM).

2. Description of the Prior Art

Random access memory (RAM) can be operated to read data from it and write data into it. As computers containing RAM turn off, data disappears from the RAM immediately. Since data in RAM can be altered easily, RAM is widely used as temporary data storage memory in personal computers. RAM can be classified into dynamic-type and static-type.

A static random access memory (SRAM: Static RAM) stores one-bit data by six transistors, and electricity is not needed during operating to keep this data, thus called Static RAM. Static RAM is a complex structure, therefore having high access speed and high cost, thereby it is often used as a memory providing low capacity but high speed such as a 256 KB or 512 KB cache memory built-in a central processing unit (CPU) of a personal computer.

A dynamic random access memory (DRAM: Dynamic RAM) stores one-bit data by one transistor paired with one capacitor, and electricity must be supported during operating to keep this data, thus called Dynamic RAM. Dynamic RAM is a simple structure, therefore having slow access speed and low cost. Thus, it is often used as a memory providing high capacity but low speed such as a main memory of a personal computer.

SUMMARY OF THE INVENTION

The present invention provides a method of forming a dynamic random access memory (DRAM), which forms dual spacers having etching selectivity by depositing and then densification, thereby reducing processing costs and circuit leakage.

The present invention provides a method of forming a dynamic random access memory (DRAM) including the following steps. A substrate includes a memory area and a logic area. A stacked structure is formed on the substrate of the memory area and a gate structure is formed on the substrate of the logic area. A first mask layer is formed on the stacked structure and the gate structure. A densification process is performed to densify the first mask layer. A second mask layer is formed on the first mask layer. A part of the second mask layer and a part of the first mask layer are removed to form a first spacer on sidewalls of the gate structure.

According to the above, the present invention provides a method of forming a dynamic random access memory (DRAM), which densifies an inner mask layer of a dual mask layer after the inner mask layer is formed to form a dual spacer having etching selectivity. Therefore, a carbon containing dual spacer including different materials can be replaced, and thus shortens processing time, reduces processing costs and decreases circuit leakage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
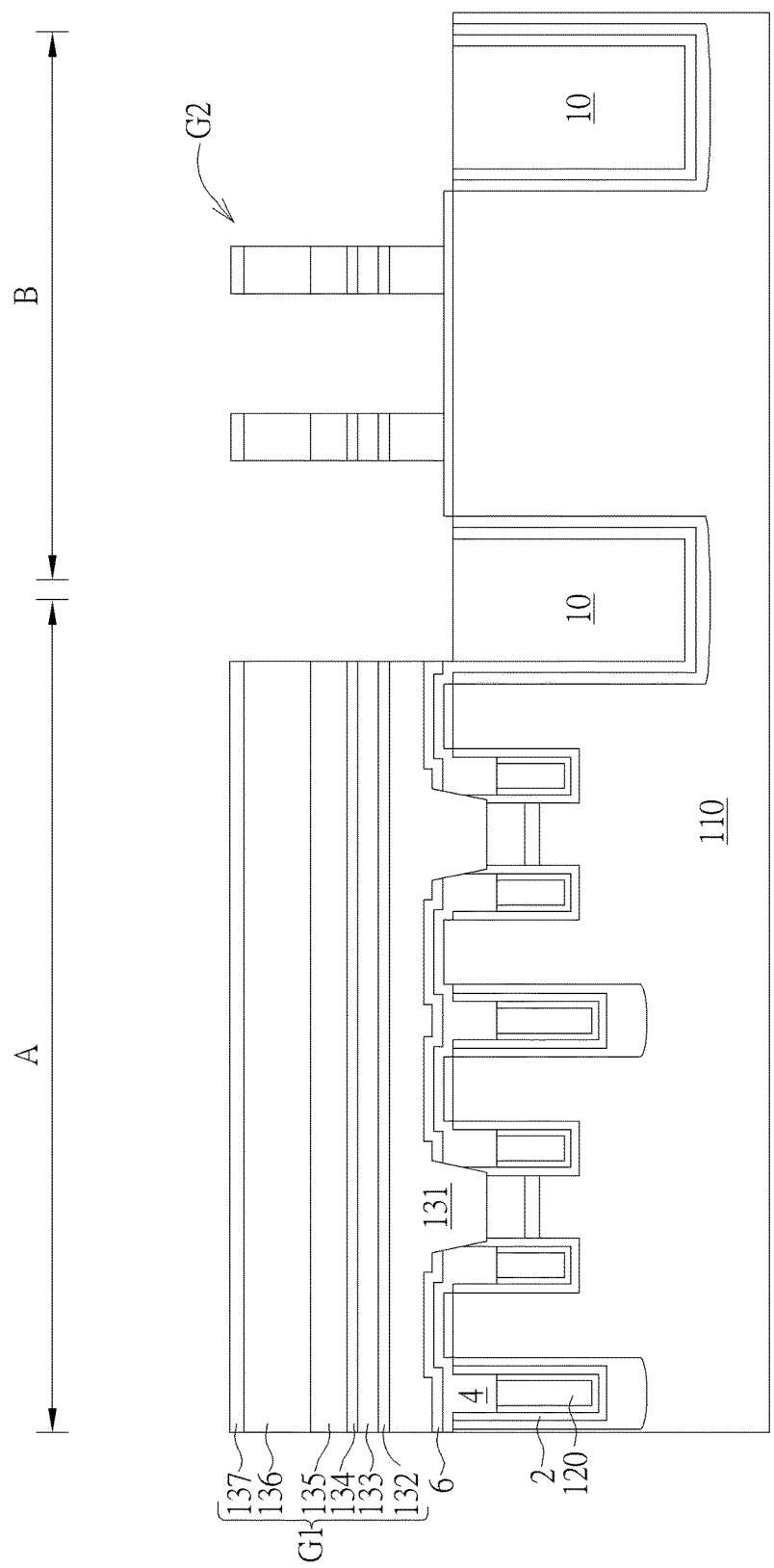
FIG. 1 schematically depicts a cross-sectional view of a method of forming a dynamic random access memory (DRAM) according to an embodiment of the present invention.

FIGS. 1-5 schematically depict cross-sectional views of a method of forming a dynamic random access memory (DRAM) according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. In this embodiment, the substrate 110 may include a memory area A and a logic area B, wherein a dynamic random access memory including recessed gates may be formed in the memory area A while MOS transistors operating the dynamic random access memory may be formed in the logic area B. A plurality of embedded gate structures 120 are disposed in the substrate 110 of the memory area A, and at least a shallow trench isolation (STI) 10 is disposed between the memory area A and the logic area B for isolating the memory area A and the logic area B. The shallow trench isolation (STI) 10 and the isolation materials covering the substrate 110 of the memory area A may include a silicon oxide layer 2, a silicon nitride layer 4 and a silicon oxide layer 6 or etc, but it is not limited thereto.

A stacked structure G1 is formed in the memory area A and at least a gate structure G2 is formed in the logic area B. In this embodiment, only one stacked structure G1 is depicted in the memory area A, and two gate structures G2 are depicted in the logic area B, but it is not limited thereto. The number of the stacked structure G1 and the gate structure G2 are not restricted thereto. More precisely, the stacked structure G1 is preferably disposed on the substrate 110 of in the memory area A and covers embedded gate structures 120 in the substrate 110, and the gate structures G2 in the logic area B are directly disposed on the surface of the substrate 110. In this case, methods of forming the stacked structure G1 and the gate structures G2 may include blanketly staking material layers (not shown) on the substrate 110 of the memory area A and the logic area B, wherein the material layers may include an amorphous silicon layer 131, a titanium layer 132, a titanium nitride layer 133, a tungsten silicon layer 134, a tungsten layer 135, a silicon nitride layer 136 and a silicon oxide layer 137. Then, a pattern transferring process may be performed such that a patterned photoresist (not shown) may be utilized to remove a part of the material layers to form the stacked structure G1 and the gate structures G2 in the memory area A and the logic area B, and then the patterned photoresist is removed, but it is not limited thereto.

Figure 2:
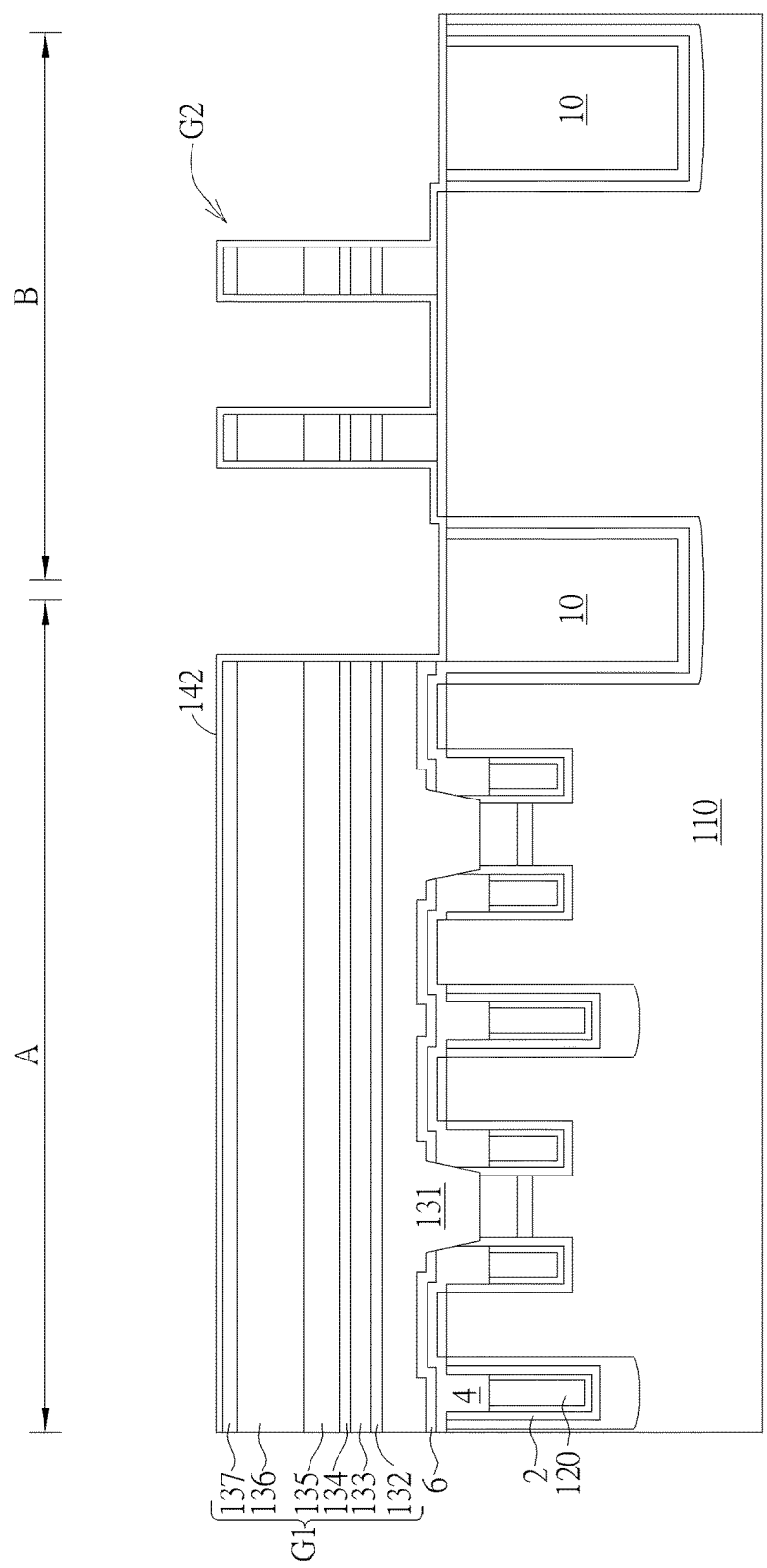
FIG. 2 schematically depicts a cross-sectional view of a method of forming a dynamic random access memory (DRAM) according to an embodiment of the present invention.

As shown in FIG. 2, a first mask layer 142 is formed on the stacked structure G1 and the gate structures G2 to cover the stacked structure G1 and the gate structures G2. In this embodiment, the first mask layer 142 is a nitride layer, and may be formed by a first atomic layer deposition (ALD) process, but it is not limited thereto. The processing temperature of the first atomic layer deposition (ALD) process is preferably 550° C.

Figure 3:
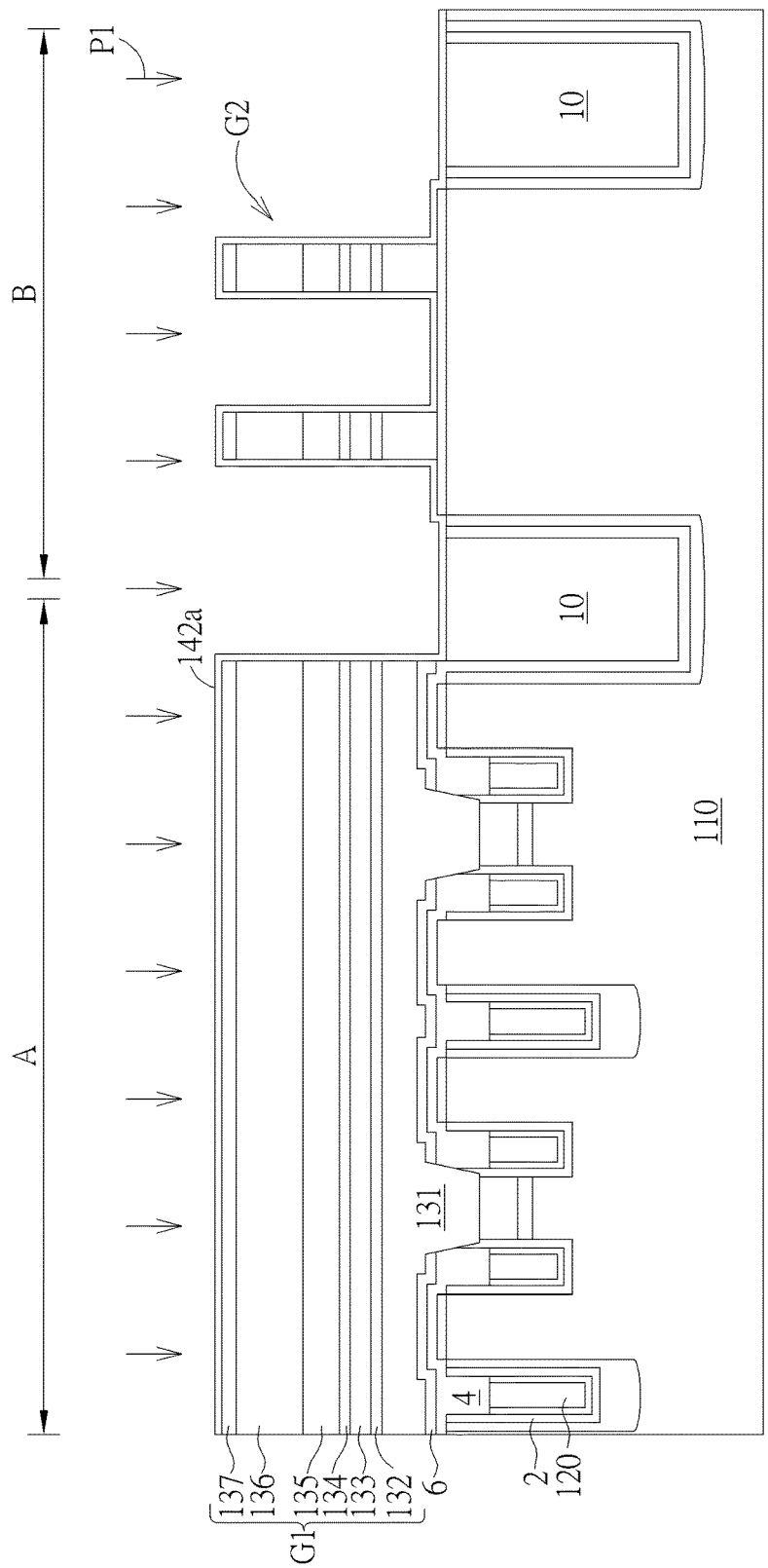
FIG. 3 schematically depicts a cross-sectional view of a method of forming a dynamic random access memory (DRAM) according to an embodiment of the present invention.

As shown in FIG. 3, a densification process P1 is performed to density the first mask layer 142, and thus a first mask layer 142a is formed. Therefore, the density of the first mask layer 142a is larger than the density of the first mask layer 142. The densification process P1 may be an annealing process, but it is not restricted thereto. In one case, the annealing process has nitrogen gas ($N_2$), argon gas (Ar), hydrogen gas ($H_2$) or oxygen gas ($O_2$) imported. As the annealing process has nitrogen gas ($N_2$), argon gas (Ar), hydrogen gas imported, the nitride layer (the first mask layer 142) can be densified. As the annealing process has oxygen gas ($O_2$) imported, the nitride layer (the first mask layer 142) can be modified into an oxynitride layer, and the density of the oxynitride layer is larger than the density of the nitride layer.

Preferably, the temperature of the annealing process is at a range of 740° C.-760° C.

Figure 4:
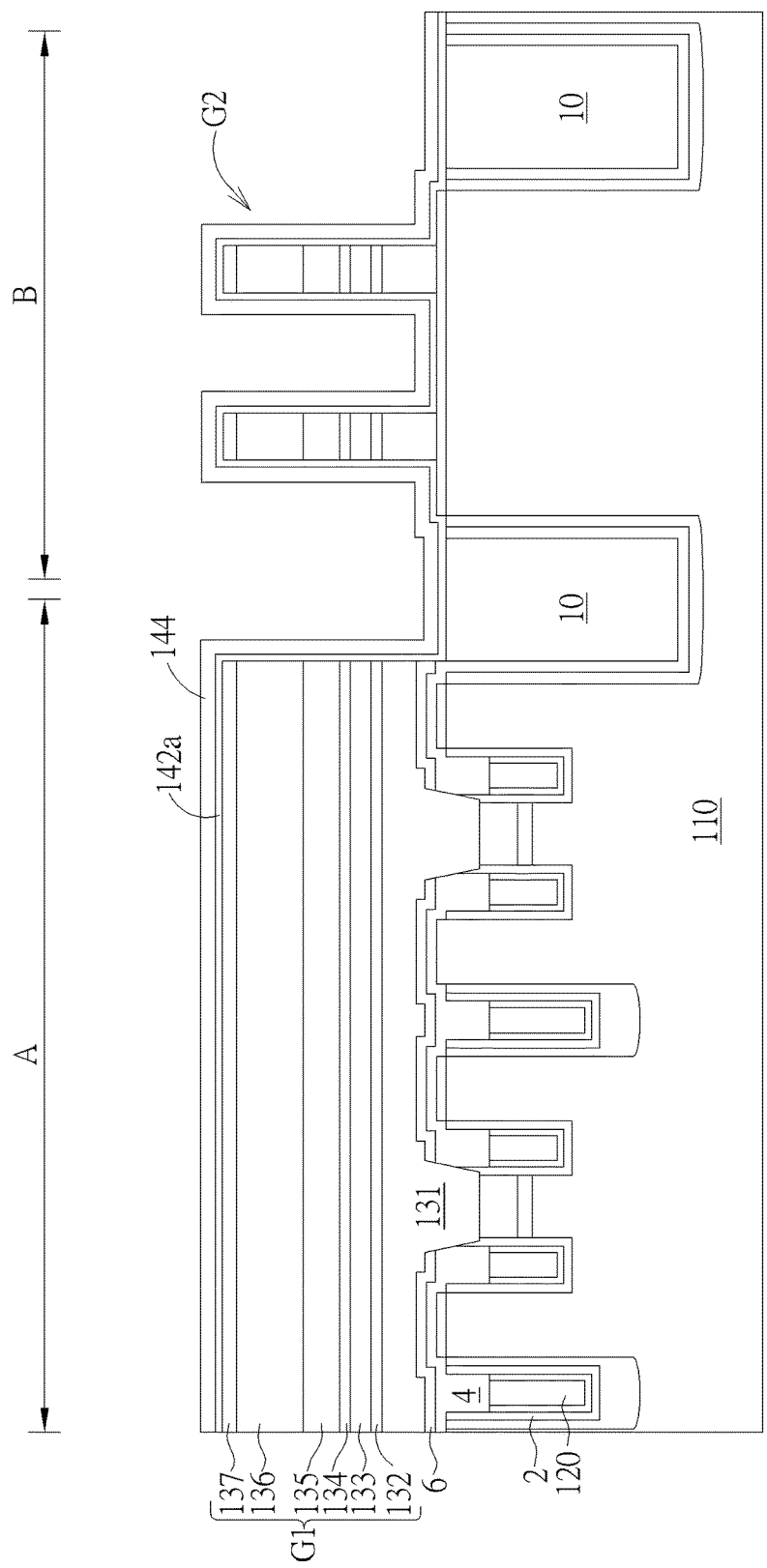
FIG. 4 schematically depicts a cross-sectional view of a method of forming a dynamic random access memory (DRAM) according to an embodiment of the present invention.

As shown in FIG. 4, a second mask layer 144 is formed on the first mask layer 142a to cover the first mask layer 142a. In this embodiment, the second mask layer 144 is a nitride layer, and may be formed by a second atomic layer deposition (ALD) process, but it is not limited thereto. The processing temperature of the second atomic layer deposition (ALD) process is preferably 550° C. The first atomic layer deposition process and the second atomic layer deposition process may preferably have common temperatures. Since the first mask layer 142a is densified from the first mask layer 142, the density of the first mask layer 142a is larger than the density of the first mask layer 142.

Figure 6:
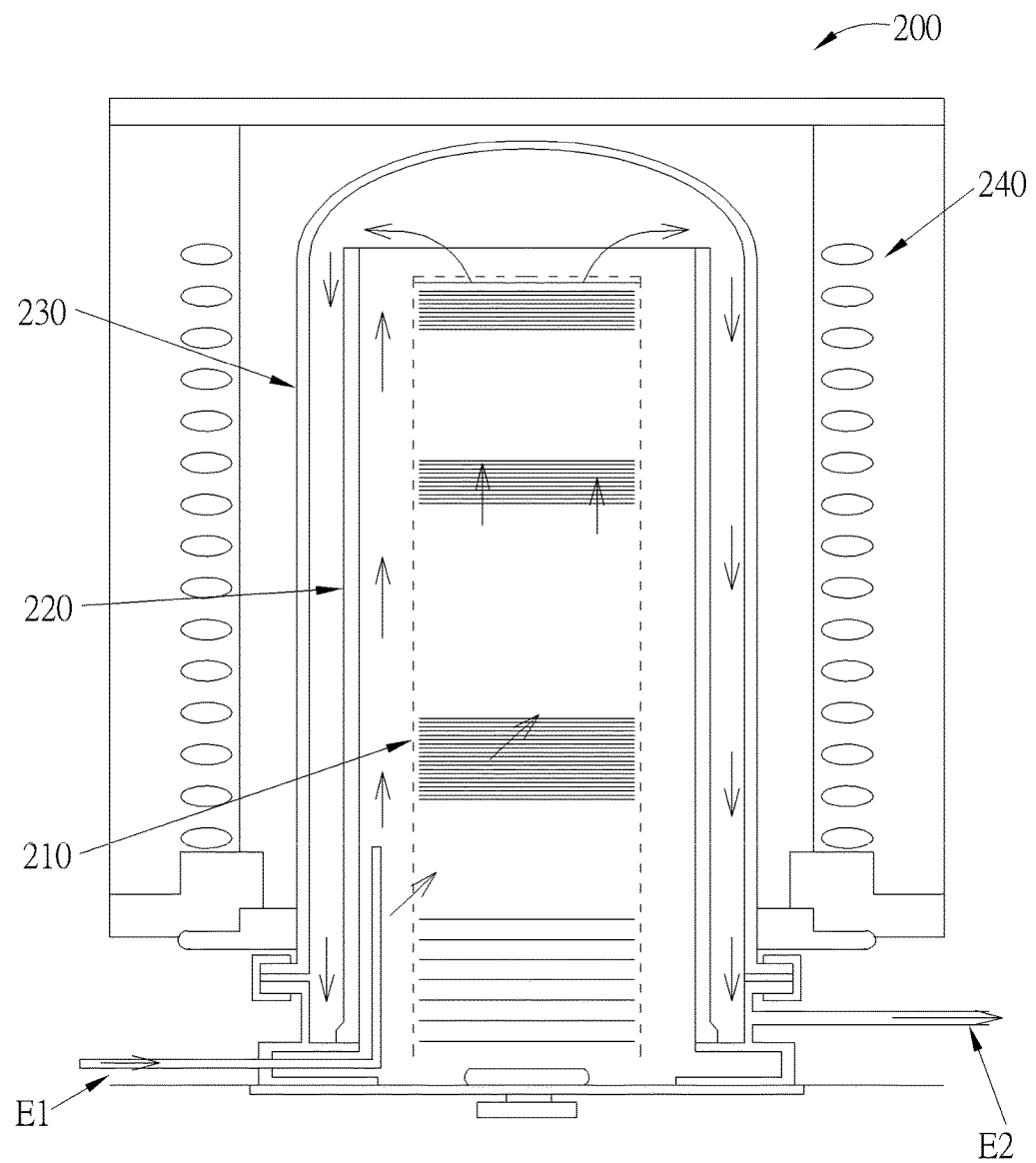
FIG. 6 schematically depicts a diagram of a low pressure furnace according to an embodiment of the present invention.

The steps of forming the first mask layer 142, performing the densification process P1, and forming the second mask layer 144 are preferably carried out at one same chamber. This shortens processing time, reduces processing costs and avoiding pollution occurring while transferring different chambers. In one case, as shown in FIG. 6, the steps of forming the first mask layer 142, performing the densification process P1, and forming the second mask layer 144 may be processed in a chamber 200, which may be a low pressure furnace, but it is not limited thereto. The chamber 200 may include a carrier 210, an inner tube 220 and an outer tube 230 disposed between the carrier 210 and a heater 240. In this way, gases imported during processes can enter the chamber 200 through a gas inlet port E1, react with wafers under a specific temperature, and then exit the chamber 200 through a gas outlet port E2.

Figure 7:
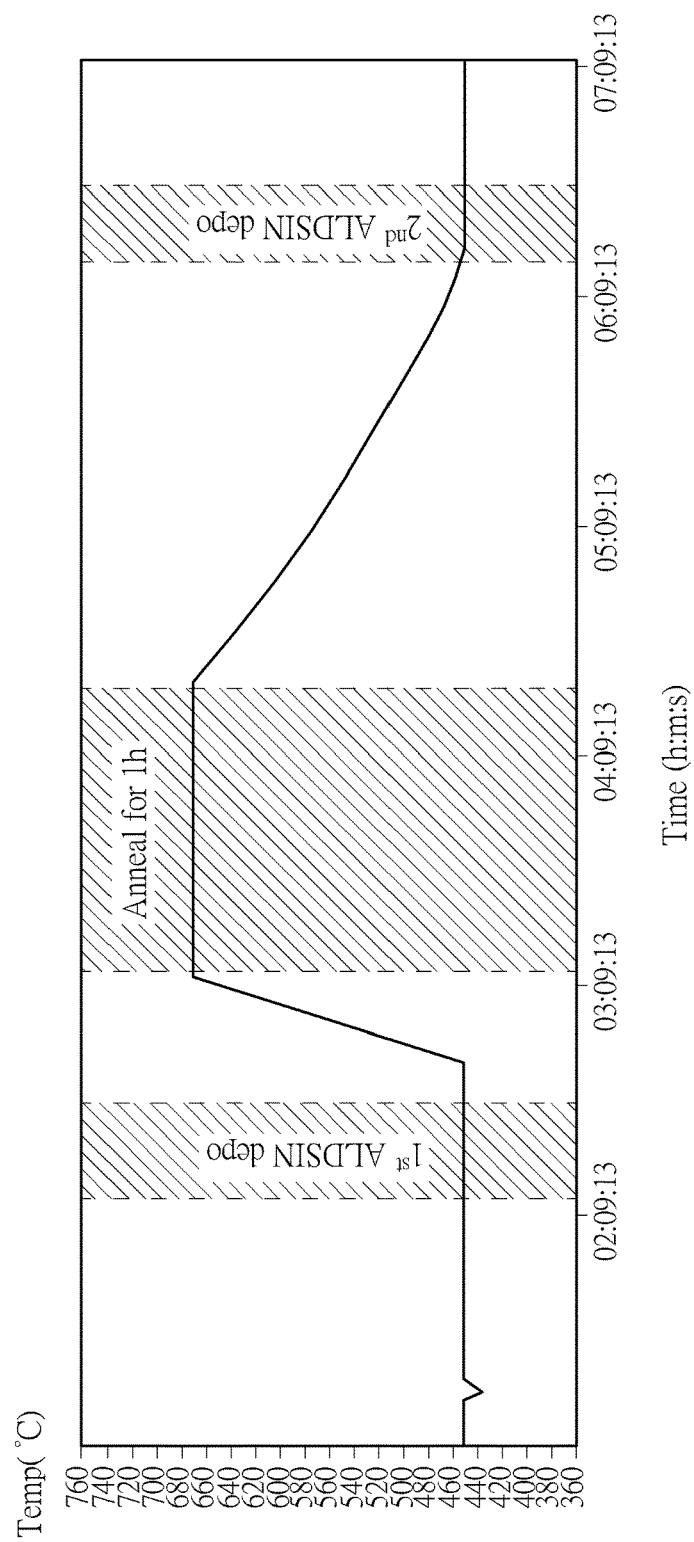
FIG. 7 schematically depicts a relation diagram of processing temperature versus processing time in a low pressure furnace according to an embodiment of the present invention.

Steps of forming the first mask layer 142 and forming the second mask layer 144 in the chamber 200 may include having dichlorosilane (DCS) gas and nitrogen gas ($N_2$)/ ammonia gas ($NH_3$) imported to form nitride layers (the first mask layer 142 and the second mask layer 144), but it is not restricted thereto. The reacting processes in the chamber 200 may include diffusing reactant on a surface of a substrate, attaching the reactant on the surface of the substrate, chemical reaction occurring on the surface of the substrate, products generating on the surface of the substrate, and then reactant leaving away from the surface of the substrate. While the densification process P1 is performed after the first mask layer 142 is formed and before the second mask layer 144 is formed, the nitrogen gas ($N_2$), argon gas (Ar), hydrogen gas ($H_2$) or oxygen gas ($O_2$) may be imported instead, and the processing temperature may increase to the range of 740° C.-760° C., but it is not limited thereto. Thereby, the nitride layers (the first mask layer 142 and the second mask layer 144) can be densified. FIG. 7 schematically depicts a relation diagram of processing temperature versus processing time during the steps of forming the first mask layer 142, performing the densification process P1, and forming the second mask layer 144. The first mask layer 142 may be formed at a processing temperature of 445° C., the densification process P1 may be performed by increasing the processing temperature to 670° C. with a processing time of one hour, and then the second mask layer 144 may be formed by decreasing the processing temperature to 445° C. This is a way applying the present invention, but the present invention is not restricted thereto.

Figure 5:
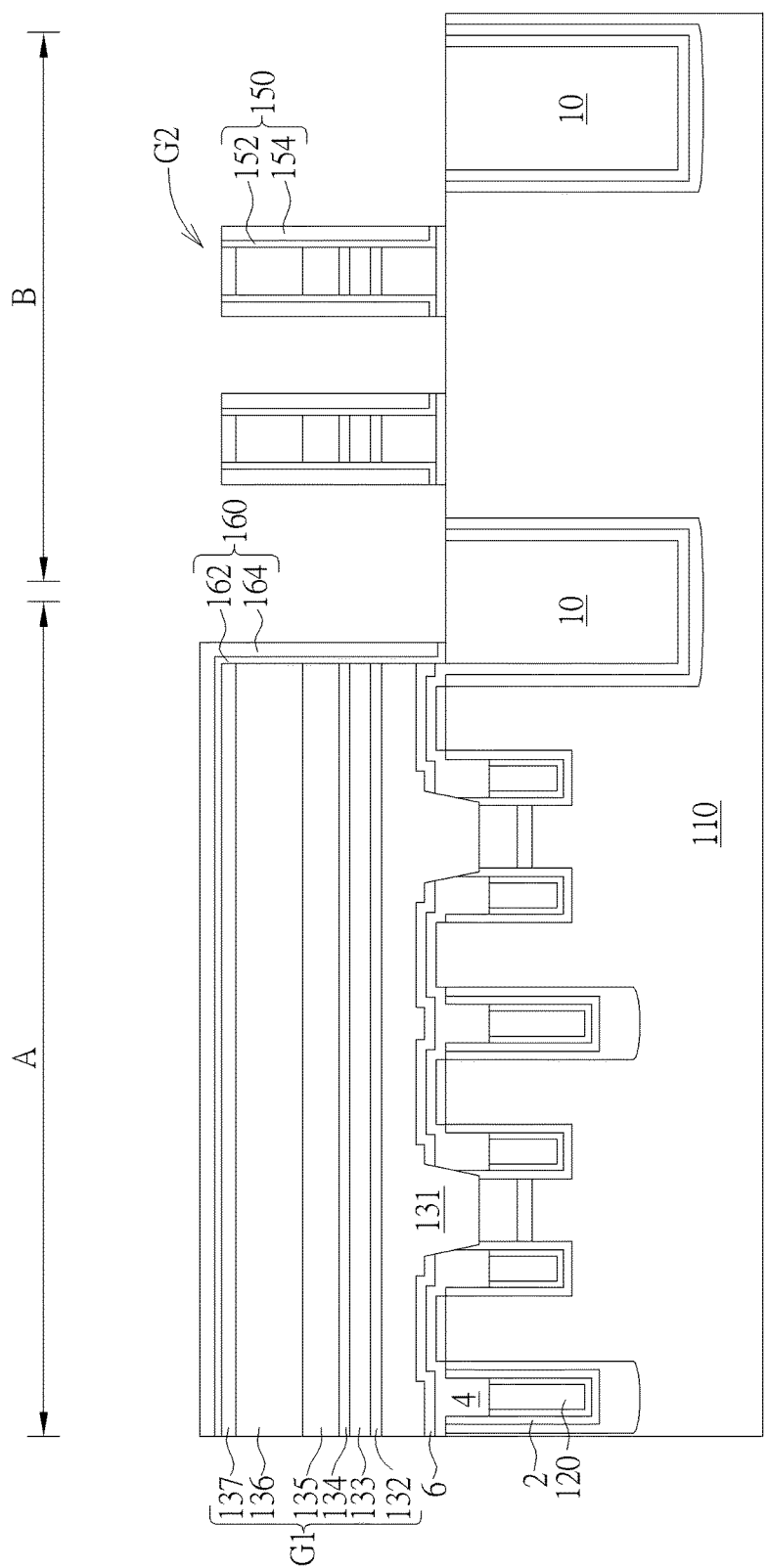
FIG. 5 schematically depicts a cross-sectional view of a method of forming a dynamic random access memory (DRAM) according to an embodiment of the present invention.

A part of the second mask layer 144 and a part of the first mask layer 142a are removed to form a first spacer 150 on sidewalls of the gate structures G2, and a second spacer 160 on sidewalls of the stacked structure G1, as shown in FIG. 5. The first spacer 150 may include an inner spacer 152 and an outer spacer 154, and the second spacer 160 may include an inner spacer 162 and an outer spacer 164, wherein the inner spacers 152/162 have L-shape cross-sectional profiles. Since the density of the first mask layer 142a is larger than the density of the second mask layer 144, the density of the inner spacers 152/162 are larger than the density of the outer spacers 154/164. In this embodiment, the first mask layer 142a and the second mask layer 144 are nitride layers, so the inner spacers 152/162 and the outer spacers 162/164 are also nitride spacers. As a wet etching process is performed to remove a part of the second mask layer 144 and a part of the first mask layer 142a to form the first spacer 150 on sidewalls of the gate structures G2 and the second spacer 160 on sidewalls of the stacked structure G1, the inner spacers 152/162 can be utilized as etch stop layers for avoiding over-etching. In this embodiment, the first mask layer 142a and the second mask layer 144 are nitride layers, so that the etchant of the wet etching process contains phosphoric acid to form the first spacer 150 and the second spacer 160, wherein the wet etching rate of phosphoric acid to the outer spacers 162/164 are larger than the wet etching rate of phosphoric acid to the inner spacers 152/162. By applying the present invention, the first spacer 150 is a nitride spacer without including carbon, thereby reducing circuit leakage.

To summarize, the present invention provides a method of forming a dynamic random access memory (DRAM), which forms a dual mask layer by one process adjusting importing gases and processing temperatures in one same chamber, and densifies an inner mask layer of the dual mask layer after the inner mask layer is formed to form a dual spacer having etching selectivity. Therefore, a carbon containing dual spacer including different materials can be replaced, and thus shortens processing time, reduces processing costs and decreases circuit leakage. Furthermore, a densification process for densifying the inner mask layer may include an annealing process, and the annealing process may have nitrogen gas ($N_2$), argon gas (Ar), hydrogen gas ($H_2$) or oxygen gas ($O_2$) imported. In a preferred embodiment, the temperature of the annealing process is at a range of 740° C.-760° C.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a dynamic random access memory (DRAM), comprising:
    providing a substrate comprising a memory area and a logic area;
    forming a stacked structure on the substrate of the memory area and a gate structure on the substrate of the logic area;
    forming a first mask layer on the stacked structure and the gate structure;
    performing a densification process to densify the first mask layer;
    forming a second mask layer on the first mask layer, wherein the first mask layer and the second mask layer comprise silicon nitride layers; and
    removing a part of the second mask layer and a part of the first mask layer to form a first spacer on sidewalls of the gate structure.

2. The method of forming a dynamic random access memory (DRAM) according to claim 1, wherein the first mask layer is formed by a first atomic layer deposition (ALD) process.

3. The method of forming a dynamic random access memory (DRAM) according to claim 2, wherein the temperature of the first atomic layer deposition process is 550° C.

4. The method of forming a dynamic random access memory (DRAM) according to claim 2, wherein the second mask layer is formed by a second atomic layer deposition process.

5. The method of forming a dynamic random access memory (DRAM) according to claim 4, wherein the temperature of the second atomic layer deposition process is 550° C.

6. The method of forming a dynamic random access memory (DRAM) according to claim 4, wherein the first atomic layer deposition process and the second atomic layer deposition process have common temperatures.

7. The method of forming a dynamic random access memory (DRAM) according to claim 1, wherein the densification process comprises an annealing process.

8. The method of forming a dynamic random access memory (DRAM) according to claim 7, wherein the annealing process comprises having nitrogen gas (N2), argon gas (Ar), hydrogen gas (H2) or oxygen gas (O2) imported.

9. The method of forming a dynamic random access memory (DRAM) according to claim 8, wherein the temperature of the annealing process is at a range of 740° C.-760° C.

10. The method of forming a dynamic random access memory (DRAM) according to claim 1, wherein the steps of forming the first mask layer, performing the densification process, and forming the second mask layer are carried out at one same chamber.

11. The method of forming a dynamic random access memory (DRAM) according to claim 1, wherein a method of removing the part of the second mask layer and the part of the first mask layer comprises using a wet etching process containing phosphoric acid.

12. The method of forming a dynamic random access memory (DRAM) according to claim 11, wherein the first spacer comprises an inner spacer and an outer spacer.

13. The method of forming a dynamic random access memory (DRAM) according to claim 12, wherein the wet etching rate of phosphoric acid to the outer spacer is larger than the wet etching rate of phosphoric acid to the inner spacer.

14. The method of forming a dynamic random access memory (DRAM) according to claim 12, wherein the density of the inner spacer is larger than the density of the outer spacer.

* * * * *